(12) United States Patent
Chaloux et al.

(10) Patent No.: US 6,310,359 B1
(45) Date of Patent: Oct. 30, 2001

(54) STRUCTURES CONTAINING QUANTUM CONDUCTIVE BARRIER LAYERS

(75) Inventors: Susan E. Chaloux, Wappingers Falls, NY (US); Caroline Aussilhou, Le Coudray-Montceaux; Corinne Buchet, Corbeil Essonnes, both of (FR); Heidi L. Greer, Essex Junction, VT (US); Rajarao Jammy, Wappingers Falls, NY (US); Patrick Raffin, Joinville le Pont; Francis Rodier, Mondeville, both of (FR); Jean-Marc Rousseau, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/559,897

(22) Filed: Apr. 26, 2000

(51) Int. Cl.⁷ .................................................... H01L 29/06
(52) U.S. Cl. ................................. 257/9; 257/301; 257/304
(58) Field of Search ................................ 257/9, 243, 247, 257/249, 301, 302, 303, 304, 305, 392; 438/249, 292, 190, 78, 60

(56) References Cited

U.S. PATENT DOCUMENTS

| | | | |
|---|---|---|---|
| 4,935,804 | 6/1990 | Ito et al. | 357/71 |
| 5,065,225 | 11/1991 | Bryant et al. | 357/71 |
| 5,138,425 | 8/1992 | Ichikawa | 357/67 |
| 5,543,318 | * 8/1996 | Hammerl et al. | 257/301 |
| 5,576,566 | * 11/1996 | Kenney | 257/301 |
| 5,844,266 | * 12/1998 | Stengl et al. | 257/301 |

* cited by examiner

Primary Examiner—David Nelms
Assistant Examiner—Dung A Le
(74) Attorney, Agent, or Firm—Steven Capella

(57) ABSTRACT

Improved reliability structures containing quantum conductive barrier layer structures are obtained by employing quantum conductive layers in combination with thin regions of amorphous or microcrystalline semiconductor material. The quantum conductive structures are especially useful when incorporated into trench capacitors to reduce or eliminate the occurrence of low temperature fails and single cell fails in DRAM circuits.

15 Claims, 6 Drawing Sheets

STRUCTURES CONTAINING QUANTUM CONDUCTIVE BARRIER LAYERS

BACKGROUND OF THE INVENTION

In construction of microelectronic devices, it is well known that there is a constant pressure for reduction of device size and/or increase of device capability at a given scale.

In the actual construction of reduced scale devices, attention must be paid to higher precision in configuring the materials from which the device components are formed. Attention must also be paid to the interaction of the various materials used in device construction during the device manufacture process, during device testing, and during device operation. In this regard, finer sized device components are more sensitive to adverse materials interactions since the amount of material forming the component is smaller. For example, an interaction that might have only affected the border area of a large component would affect an entire component of smaller scale (e.g., where the scale of the smaller component is the same size as the border area of the larger component). Thus, reduction in component scale forces consideration of materials interaction problems which could have been viewed as non-critical for larger scale components.

In the context of devices such as deep trench capacitors in semiconductor substrates, the various materials used to form the components of the capacitor such as the capacitor plates (electrodes), the dielectric barrier between electrodes, oxide collar structures to prevent or minimize parasitic effects, surface or buried straps to provide contact between the capacitor and the other circuitry of the device, etc. For example, the electrode in the trench is typically a highly doped polycrystalline silicon (polysilicon) material, the buried or surface strap is typically an amorphous silicon, and the semiconductor substrate is a monocrystalline silicon. The successful functioning of the capacitor depends in part on the ability of these diverse materials to maintain their original or desirably modified character during manufacture/ useful life of the device.

Unfortunately, the nature of these materials is such that unwanted interactions may occur unless otherwise prevented.

For example, a problem may be caused by the difference in crystallinity (or grain size) between the monocrystalline silicon substrate and the amorphous or polysilicon silicon trench electrode material, especially where there is an intervening amorphous silicon material. In such configurations, the amorphous or polysilicon layer may template on the monocrystalline surface and recrystallize. Often, defects are created at the interface with the monocrystalline silicon during recrystallization which may propagate into the monocrystalline silicon. The occurrence of such defects is believed to adversely affect memory cell performance (the memory cell containing the capacitor). Specifically, the defects are believed to cause a lack of predictability of the charge retention time for the capacitor (so-called variable retention time). Such lack of predictability may limit the usefulness of the resulting device and/or the ability to maximize design performance.

U.S. patent application Ser. No. 09/213,674, filed Dec. 17, 1998, discloses use of quantum conductive barriers in trench capacitors to address variable retention time problems. Nevertheless, there is a need for quantum conductive barrier materials and structures that provide improved trench capacitor performance, especially reduced single cell fails and low temperature fails. There is also a need for improved quantum conductive barrier materials which provide improved control over dopant atoms commonly present in semiconductor electronic devices.

SUMMARY OF THE INVENTION

The invention provides novel and improved quantum barrier layer structures and compositions which enable reduced scale capacitor structures of improved reliability and other device structures where the quantum conductive barrier function is desired. The invention also provides improved materials configurations which enable improved performance of existing quantum conductive barrier technology.

In one aspect, the invention encompasses quantum conductive barrier layer structures comprising a quantum conductive barrier layer with an adjacent layer of amorphous, microcrystalline semiconductor material or partially crystalline semiconductor material. Alternatively, the invention encompasses quantum conductive barrier layer structures comprising a plurality of quantum conductive barrier layers with thin layers of amorphous, microcrystalline or partially crystalline semiconductor material therebetween.

In another aspect, the invention encompasses improved quantum conductive barrier layer compositions comprising Si—O—N materials having improved dopant ion diffusion characteristics enabling control (in combination with the thermal history of the subject device) of dopant concentration and depth profile.

In another aspect, the invention encompasses deep trench capacitors comprising a quantum conductive barrier structure of the invention.

In another aspect, the invention encompasses device structures using quantum conductive barrier structures of the invention.

The invention also encompasses methods for making the above structures and devices.

These and other aspects of the invention are described in further detail below.

DETAILED DESCRIPTION OF THE INVENTION

The invention encompasses improved quantum conductive barrier structures and compositions, devices containing those quantum conductive barrier structures and methods of making which enable the formation of reduced scale capacitor structures and other reduced scale devices of improved reliability.

Figure 1A:
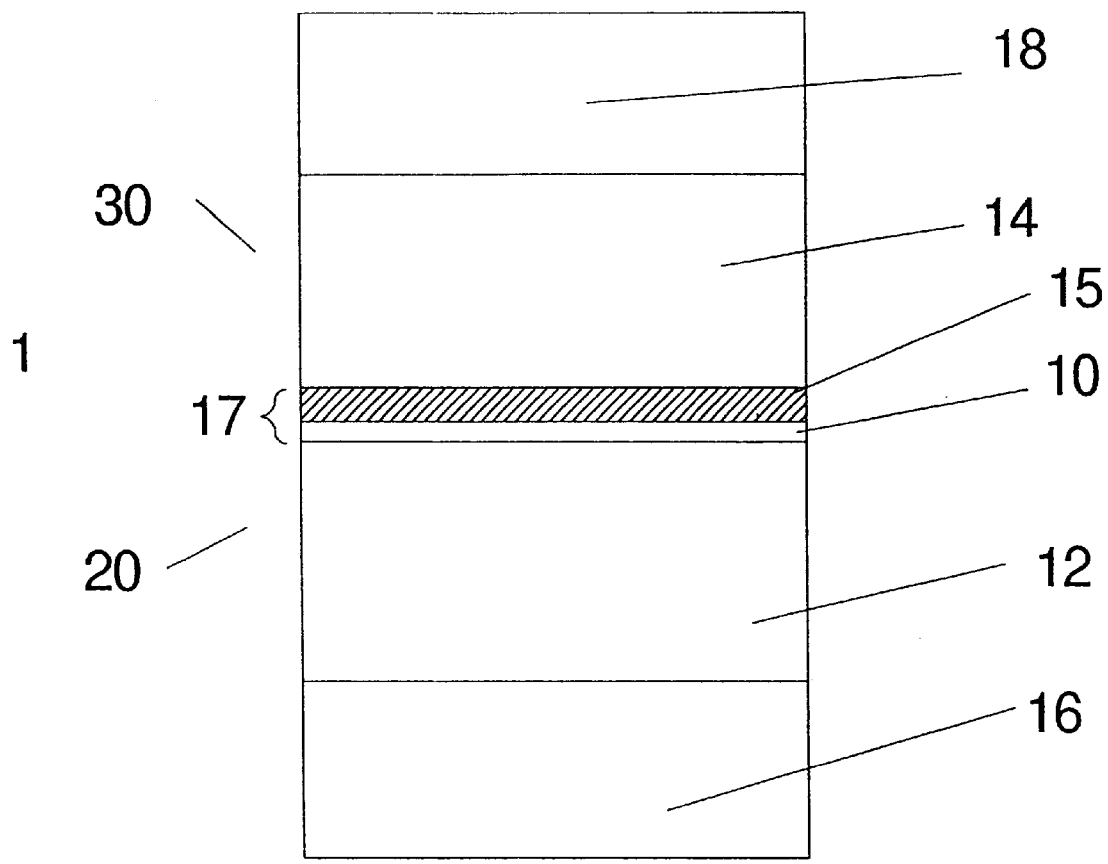
FIG. 1A is a schematic cross section of a structure having contiguous regions with a quantum conductive barrier structure according to an embodiment of the invention.

Referring to FIG. 1A, the quantum conductive barrier structures of the invention are characterized by the presence of a quantum conductive layer 10 and an amorphous, microcrystalline, or partially crystalline semiconductor material layer 15 adjacent to the quantum conductive layer 10. The two components together form an embodiment of a quantum conductive barrier structure 17. In FIG. 1A, the relative thickness of quantum conductive layer 10 has been exaggerated for ease of illustration. In addition to barrier structure 17, structure 1 contains regions 12 and 16 on a first side 20 of quantum conductive barrier structure 17 and regions 14 and 18 on the second side 30 of barrier structure 17. Preferably, structure 1 is such that at least one region on first side 20 differs from at least one region on second side 30 in (a) average grain size, (b) degree of crystallinity, and/or (c) composition (e.g., dopant concentration).

The quantum conductive barrier structures of the invention preferably act to control the undesired effects of such differences between the regions on one side of the quantum conductive barrier structure 17 and the regions on the other side over the thermal history experienced by the structure. For example, the quantum conductive barrier structure may be used to prevent or hinder forces associated with recrystallization of a region (e.g., region 14) from inducing changes in the crystallinity or crystal structure of regions 12 or 16 on the other side of barrier structure 17. If region 14 were a polycrystalline silicon and region 12 were a monocrystalline silicon, quantum conductive barrier structure 17 could be used to prevent or inhibit stresses associated with recrystallization of regions 14 or 18 (e.g., as might occur in thermal processing of the overall structure 1) from being transmitted to monocrystalline region 12 where those stresses could cause an undesired propagation of defects in the monocrystalline structure. The present invention encompasses the discovery that incorporation of layer 15 adjacent to quantum conductive layer 10 further enhances the performance of the quantum conductive barrier layer 10 and performance of any resulting device, especially where region 14 is a polycrystalline semiconductor material and region 12 is a monocrystalline semiconductor material.

The quantum conductive layers of the invention are very thin films of materials which in their bulk properties would be considered dielectrics (i.e., electrical insulators). In very thin layers, however, these materials become electrically conductive. Advantageously, these thin layers have the ability to prevent or reduce transmission of forces associated with recrystallization from one side of the layer to the other. The bulk resistivity (measured in a thick section at 25° C.) of the materials used to make up the quantum conductive layers of the invention is preferably at least about $10^6$ ohm-m, more preferably at least about $10^8$ ohm-m, most preferably at least about $10^{11}$ ohm-m.

The quantum conductive layers preferably have a thickness of about 50 Å or less, more preferably about 5–30 Å, most preferably about 5–15 Å. The resulting films preferably have a film resistivity of less than about 1 K-ohm - $\mu m^2$, more preferably less than about 100 ohm-$\mu m^2$. The series resistance introduced by the quantum conductive layer is equal to the film resistivity (ohm-$\mu m^2$) divided by the cross sectional area ($\mu m^2$) of the quantum conductive layer normal to the direction of current.

The quantum conductive layers of the invention are preferably substantially uniform, however some variation in thickness may be permissible. Preferably, the layer thickness is kept in a range permitting the quantum conductive effect to take place for all points on the layer while performing the desired barrier function.

Preferred quantum conductive materials are inorganic oxides or nitrides, more preferably silicon nitride compounds selected from the group consisting of silicon nitride or silicon oxynitride. These compounds may be stoichiometric or non-stoichiometric. Alternatively, other ceramic materials such as, for example, alumina, germanium oxide, yttria-stabilized zirconia, or other forms of zirconia may also be used. The layer composition may be determined by secondary ion mass spectroscopy (SIMS) or other suitable technique.

The invention also encompasses the discovery that certain quantum conductive barrier layer compositions appear to exhibit desirable dopant diffusion barrier properties, especially where the dopant species is arsenic, boron, phosphorus, or antimony. Advantageously, the diffusion barrier properties of the barrier layers can be controlled independent of their quantum conductive properties. These quantum conductive layer materials preferably consist essentially of Si, O and N atoms. Preferably, the compositions have an oxygen concentration of about $1.6 \times 10^{14}$ to $3.5 \times 10^{15}$ atoms/cm$^2$, more preferably about $1.7 \times 10^{15}$ to $2.2 \times 10^{15}$ atoms/cm$^2$, and a nitrogen concentration of about $1.2 \times 10^{14}$ to $3.5 \times 10^{15}$ atoms/cm$^2$, more preferably about $2.0 \times 10^{15}$ to $3.5 \times 10^{15}$ atoms/cm$^2$, said concentrations being measured by SIMS. The balance of the quantum conductive compositions is preferably silicon. The quantum conductive compositions preferably have a carbon concentration of less than about $1 \times 10^{14}$ atoms/cm$^2$. The presence of significant amounts carbon generally acts to inhibit electrical conduction to a great extent. The carbon content can be limited by creating/maintaining a clean substrate/processing environment. If there is a circumstance where increased carbon content is desired, such content can be obtained by implantation or other suitable technique.

The invention encompasses use of these quantum conductive barrier compositions in the quantum conductive structures of the invention or as separate quantum conductive barrier films for other applications, e.g., in the structures described in U.S. patent application Ser. No. 09/295,132, filed Apr. 20, 1999, the disclosure of which is incorporated herein by reference.

Figure 1B:
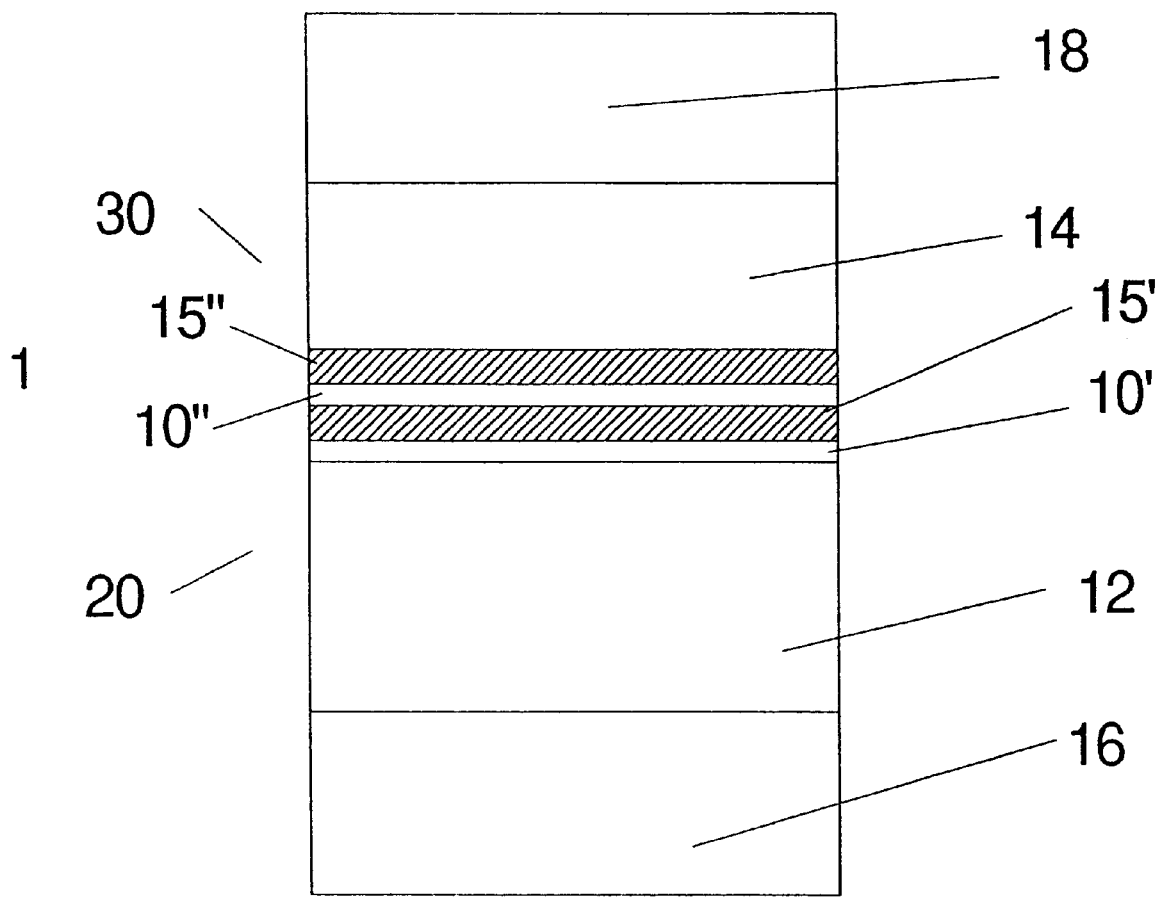
FIG. 1B is a schematic cross section of a structure having contiguous regions with a quantum conductive barrier structure containing a plurality of quantum conductive layers.

The adjacent semiconductor material layer 15 is important for improving reliability of devices containing the quantum conductive barrier structures of the invention. This companion semiconductor material layer is preferably either amorphous, partially crystalline or polycrystalline. Where the companion layer is partially crystalline or polycrystalline, the layer preferably has a reduced average grain size compared to any adjacent polycrystalline regions. Preferably, the companion layer is deposited as an amorphous layer. During subsequent thermal processing of the substrate, the layer may become partially or fully crystalline. Alternatively, the companion layer may be formed as a partially crystalline or polycrystalline layer. In such instances, preferably the layer is crystallized in a manner to provide a reduced grain size (e.g., compared to a bulk polycrystalline semiconductor material). Preferably, the companion layer is a silicon semiconductor. The companion layer may be doped or undoped. Where the layer is deposited as a polycrystalline material, it is preferably highly doped. Any dopant selected should be of an appropriate conductivity type for the overall device structure. Where a plurality of quantum conductive layers and companion layers is used (e.g., FIG. 1B), the quantum conductive layers 10' and 10" the companion layers 15' and 15" may be of differing or similar composition and crystallinity. The semiconductor companion layer(s) preferably has a thickness of about 10–3000 Å, more preferably about 50–500 Å.

While the invention is not limited to any specific compositional makeup for the regions of the structure bordering or contiguous with the quantum conductive barrier structure, preferably, at least one of the regions directly contacting the quantum conductive layer is a monocrystalline semiconductor material, more preferably silicon. The monocrystalline silicon material may be doped or undoped. Preferably, the companion semiconductor layer of the quantum conductive barrier structure is adjacent to another quantum conductive layer (i.e., between two quantum conductive layers) or it is adjacent to a bulk polycrystalline semiconductor region. If adjacent to a polycrystalline semiconductor region, the companion semiconductor layer preferably has a smaller grain size than the bulk polycrystalline semiconductor region or is amorphous.

The quantum barrier structures of the invention are especially useful in trench capacitor structures and at contacts to shallow junctions (i.e., where avoidance of punch-through is desired). Examples of typical trench capacitor structures are shown in U.S. Pat. Nos. 5,283,453; 5,395,786; 5,434,109; 5,489,544; 5,512,767; 5,576,566; 5,656,535; and 5,677,219, the disclosures of which are incorporated herein by reference. The trench capacitor structures of the invention are not limited to any specific configuration. Examples of shallow junctions are disclosed in U.S. patent application Ser. No. 091295,132 referred to above.

The invention encompasses a deep trench capacitor in a monocrystalline semiconductor substrate, the capacitor comprising (i) a buried plate in the substrate about an exterior portion of a trench in the substrate, (ii) a node dielectric about at least a lower interior portion of the trench, (iii) an electrode in the trench, and (iv) a conductive strap extending away from the trench electrode, at least a portion of the conductive strap being electrically connected to the trench electrode and the monocrystalline substrate, the capacitor further comprising (v) a quantum conductive barrier layer structure between the monocrystalline substrate and the trench electrode, the quantum conductive barrier structure comprising a quantum conductive layer and a thin semiconductor layer. The quantum conductive barrier structure may be present (i) between the strap and the monocrystalline substrate, and/or (ii) between the strap and the trench electrode.

The position of the quantum conductive barrier structures of the invention is described below in connection with a conventional buried strap trench capacitor, however, the invention is not limited to any specific strap configuration. Thus, the invention is similarly useful in conjunction with trench capacitors having notch straps, divot straps, lip straps or surface straps.

Figure 2:
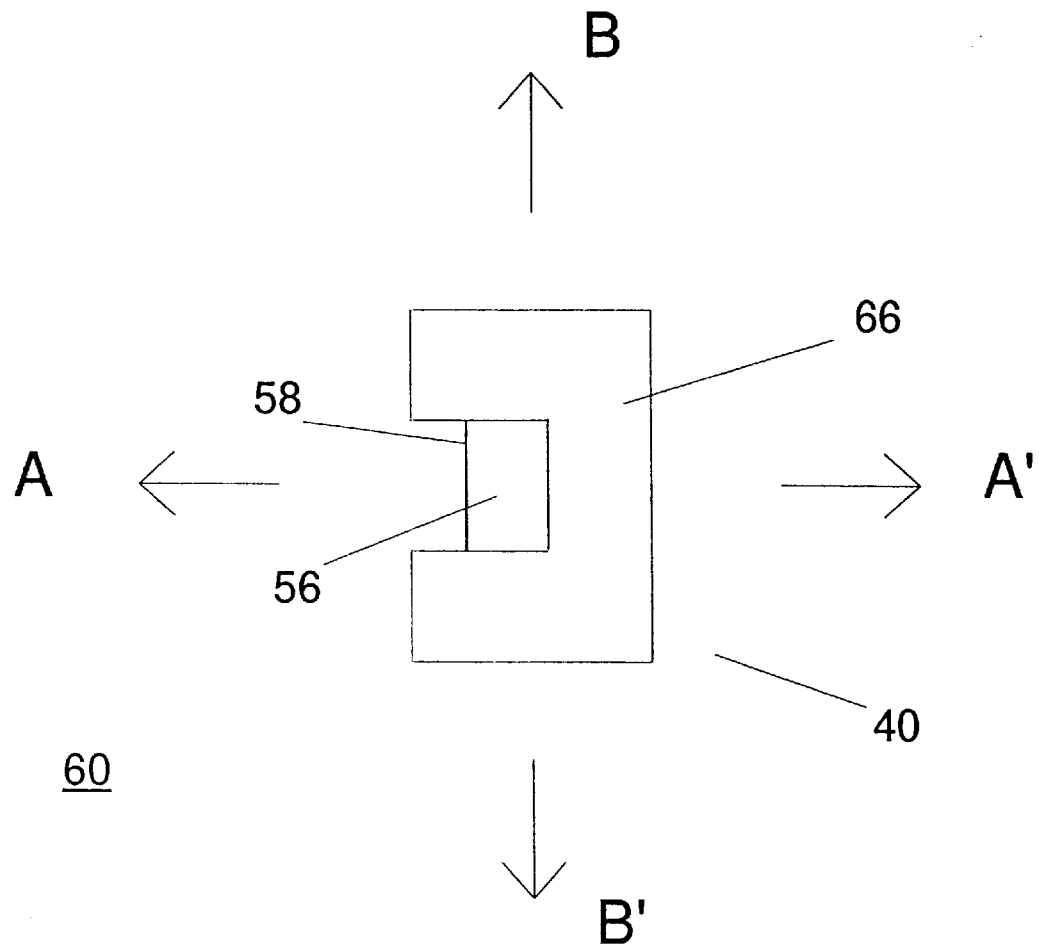
FIG. 2 is a schematic plan view of a deep trench capacitor taken from trench top level with the buried strap exposed.

FIG. 2 shows a schematic plan view of a typical trench capacitor structure 40 taken at the top of the trench in substrate 60 with the buried strap 56 exposed to reveal interface 58 between substrate 60 and strap 56. Shallow trench isolation (STI) 66 surrounds the top area of capacitor 40 on three sides.

Figure 3A:
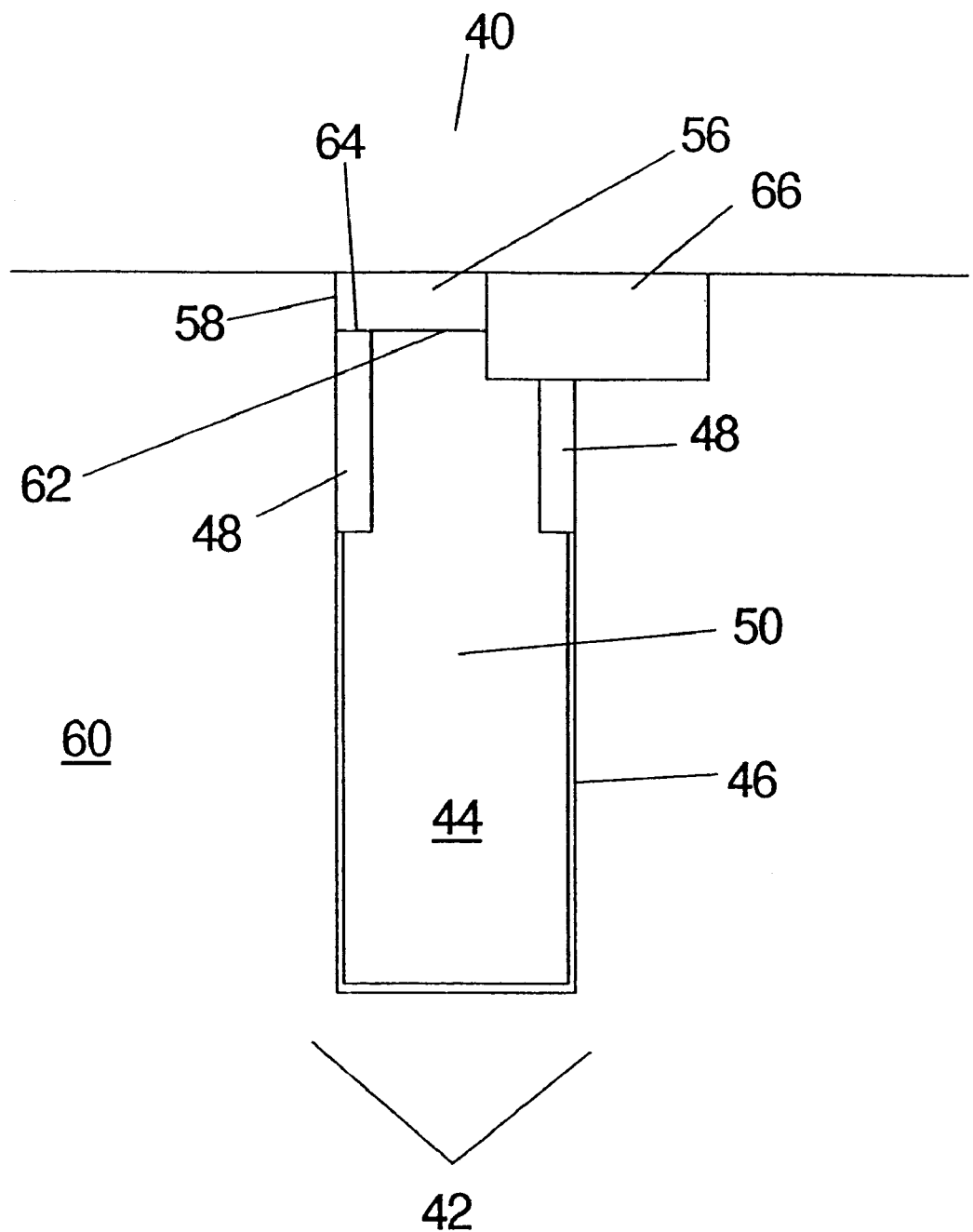
FIG. 3A is a schematic cross section of the deep trench capacitor structure of FIG. 2 at line A–A'.

FIG. 3A shows a schematic side view of the trench capacitor of FIG. 2. A buried plate electrode 42 is located about the exterior of a lower portion of the trench 44. A node dielectric 46 is present about the lower portion of the interior of trench 44. About the upper interior of trench 44 is an oxide collar 48. Trench 44 is filled with a conductive trench electrode material 50. A conductive strap 56 resides over and is electrically connected to trench electrode 50. Strap 56 thus provides electrical access to capacitor 40.

Figure 3B:
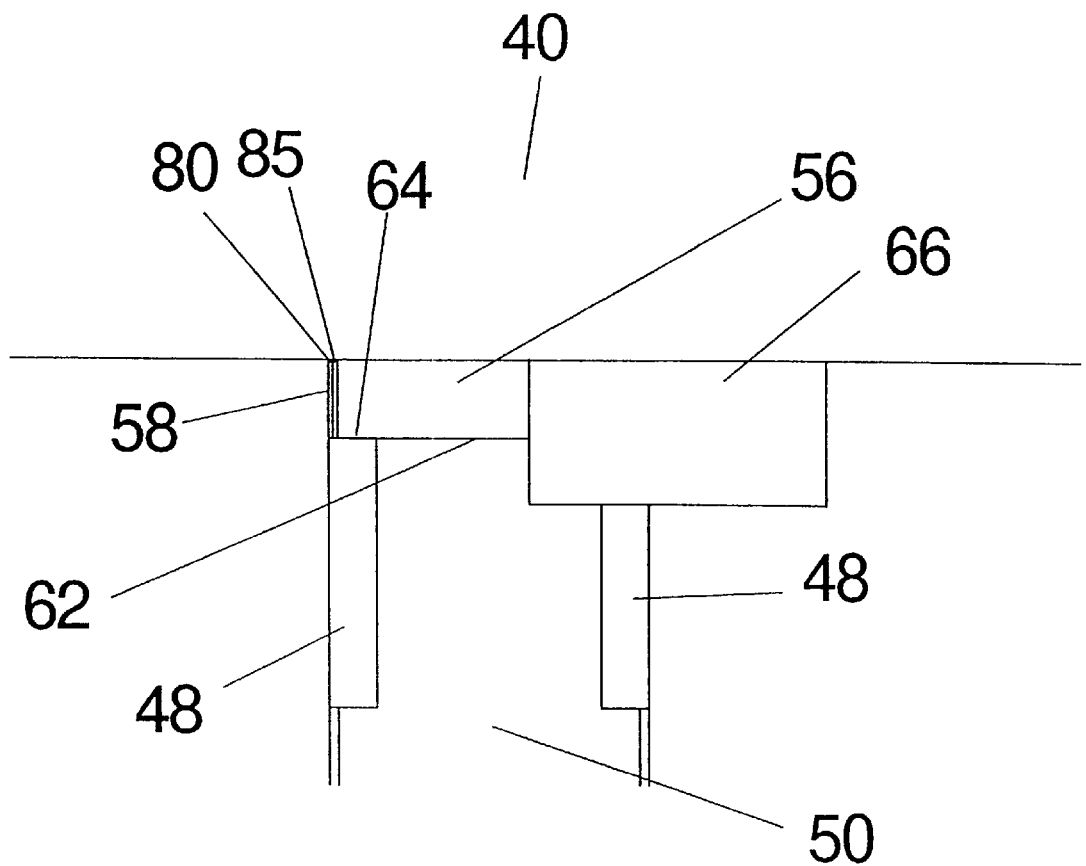
FIG. 3B is a portion of FIG. 3A in the strap region showing layers of a quantum conductive barrier structure.
Figure 4:
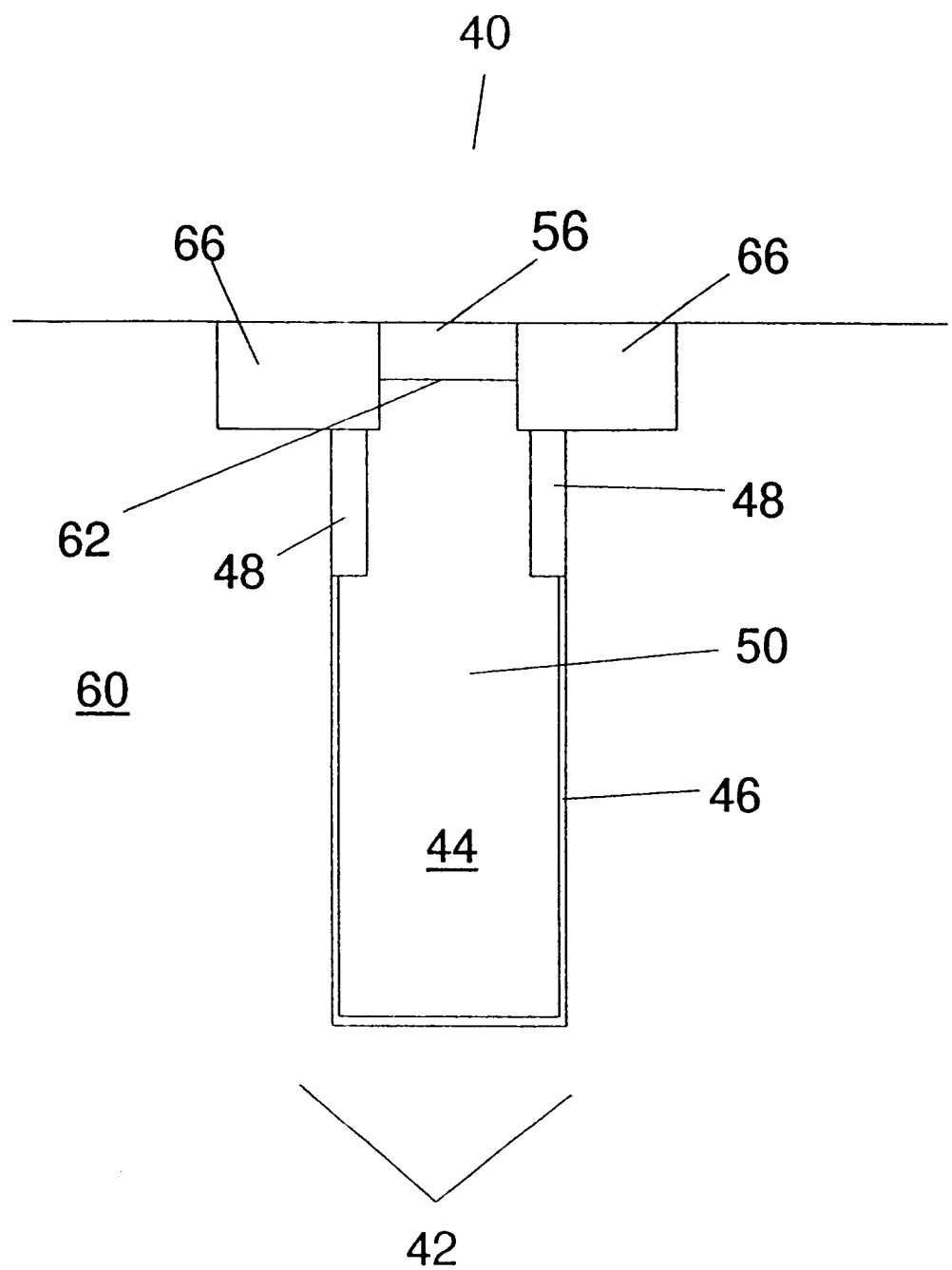
FIG. 4 is a schematic cross section of the deep trench capacitor structure of FIG. 2 at line B–B'.

The quantum conductive barrier structures of the invention may be located at one or more locations within the trench capacitor structure as desired to prevent unwanted interactions. For example (FIG. 3B), a quantum conductive barrier structure (e.g., including a quantum conductive layer 80 and a companion layer 85) may be located at interface 58 between conductive strap 56 and substrate 60. Such a quantum conductive barrier structure would be useful in preventing or inhibiting undesired transmission of recrystallization defects from strap 56 and/or trench electrode 50 to substrate 60. If desired, a quantum conductive barrier structure may also be located at interface 62 between trench electrode 50 and strap 56. Such a quantum conductive barrier structure would also be useful in preventing or inhibiting undesired transmission of recrystallization defects from trench electrode 50 to strap 56 and substrate 60. A side-effect of the use of the quantum conductive barrier structures of the invention may be an inhibition of dopant diffusion from one side of the barrier layer to the other, especially if one of the above mentioned Si—O—N quantum conductive compositions is employed.

The invention encompasses trench capacitor structures where quantum conductive barrier structures are located at one or more of the interfaces described above and/or at other locations within the capacitor structure as desired. Where the quantum conductive layer is formed by chemical vapor deposition, physical vapor deposition or sputtering, the layer may also optionally be present at the interface 64 between collar oxide 48 and strap 56.

The composition and physical characteristics of the quantum conductive barrier structures used in the trench capacitors of the invention are preferably those described above with regard to general structures incorporating quantum conductive barrier structures. Advantageously, the quantum conductive barrier structures of the invention can perform the desired barrier function without adversely affecting the electrical performance of the trench capacitor, but with even further improved device reliability.

The invention is not limited to any specific material compositions for the various components of the trench capacitor (or other device). If desired, materials described in the art may be used. Thus, the trench electrode 50 would typically be made of a doped polycrystalline silicon or other suitably conductive material. Strap 56 would typically be made of amorphous silicon. Substrate 60 would typically be a monocrystalline semiconductor material (most typically silicon, lightly doped silicon or silicon having lightly doped bands). The buried plate 42 is typically a high dopant (e.g., arsenic) region within the substrate. The collar 48 and shallow trench isolation 66 are typically a silicon dioxide.

The use of alternative or modified materials may be enabled by the presence of the quantum conductive barrier structures of the invention. For example, trench electrode materials having very high dopant levels may be used (e.g., $5 \times 10^{18} - 10^{21}$, more preferably $5 \times 10^{19} - 10^{20}$ dopant atoms per $cm^3$). Alternative trench electrode materials (e.g., silicides, conductive metal nitrides, etc.) may also be used in place of conventional doped polysilicon. The composition of the strap may also be altered in the presence of suitable quantum conductive barrier structures.

While the quantum conductive barrier structures of the invention are especially useful in trench capacitor structures, it should be understood that the layers may be used in other integrated circuit components where very thin conductive barrier layers are desired to prevent transmission of recrystallization defects, diffusion, and/or other materials interactions.

The quantum conductive barrier structures of the invention may be made by various methods. The choice of method may depend on the composition of the surface on which the quantum conductive layer is to be formed and/or the desired quantum conductive layer composition. The choice may also vary depending on the number of quantum conductive layer/companion layer combinations are to be used.

Where the surface on which the layer is to be formed has a high silicon content (e.g., a conventional (doped or undoped) polycrystalline, amorphous or monocrystalline silicon), the quantum conductive layer is preferably formed by reacting a portion of the silicon at the immediate surface with a nitrogen-containing compound in the atmosphere contacting the surface. Preferred nitrogen-containing compounds are those which are easily handled in a gaseous state. Examples of preferred nitrogen compounds are selected from the group consisting of ammonia, NO, $N_2O$ or (under plasma conditions) monatomic nitrogen. Ammonia is the most preferred nitrogen compound. The atmosphere may also contain one or more diluent gases such as $N_2$, helium or argon. The partial pressure of the nitrogen compound is preferably about 1–760 Torr, more preferably about 5–10 Torr. The reaction is typically facilitated by heating to a temperature of about 300–950° C., more preferably about 350–750° C. The reaction may be conducted until the desired layer thickness is formed. Preferably, the reaction is conducted for about 1–30 minutes, more preferably about 10–20 minutes. The reaction is typically self-limiting under these conditions. Alternatively, a high temperature (e.g., 950° C.) nitridation may be used in some circumstances.

If desired, the substrate may be precleaned by a chemical etch (e.g. HF solution) and/or by a high temperature (e.g., about 900°–100° C.) bake in a hydrogen atmosphere (or other appropriate reducing atmosphere) to remove some or all of any pre-existing oxide surface layer. The techniques described in U.S. Pat. No. 5,194,397 may also be used to control the presence of oxide film. Other known methods for removal of residual films may also be used where appropriate.

Where an oxynitride quantum conductive layer is desired, the above nitrogen reaction process may be conducted with a substrate having a pre-existing very thin oxide layer. In such instances, the relative contents of oxygen and nitrogen in the quantum conductive layer can be controlled by the temperature and time of the nitrogen compound reaction, with higher temperatures and longer reaction times giving a more nitrogen-rich layer. Alternatively, H desired, oxynitride layers may be formed by introducing a very minor amount of oxygen into the nitrogen compound-containing atmosphere. In general, this method is generally less preferred since control of the oxygen content and/or layer thickness may be difficult. To produce the preferred Si—O—N compositions of the invention, the above conditions can be used with nitriding temperatures in the range of about 650–800° C. Alternatively, plasma techniques, such as remote plasma can be used to generate desired barrier layer structures.

Where reaction of the underlying surface is not desired or not practical, the quantum conductive layer may be formed by chemical vapor deposition, physical vapor deposition or sputtering. In such instances, the reactants for forming the quantum conductive layer may be those typically used to form thin film layers of the corresponding dielectric material, however the reaction conditions (time, temperature, pressure) and/or proportions of the reactants must be appropriately reduced to avoid deposition of an excessively thick film. See for example the process for forming germanium oxide thin films described in U.S. Pat. Nos. 5,648,861 and 5,051,786, the disclosures of which are incorporated herein by reference. Alternative methods for forming the desired thin films may be found in the "Handbook of Thin Film Technology" by Maissel & Glang, McGraw-Hill Book Co. (1970) and in similar treatises.

The companion layer is preferably formed by depositing an amorphous silicon or polycrystalline silicon layer using techniques known in the art. Where the companion layer is to be adjacent to a bulk polycrystalline region, the companion layer is preferably highly doped. Where a quantum conductive barrier structure containing a plurality of quantum conductive layers is desired, the above layer forming steps can simply be repeated with or without variation of the layer compositions as desired.

Trench capacitor structures containing the quantum conductive barrier structures of the invention may be formed by inserting one of the above barrier structure formation techniques at an appropriate point(s) in the overall process of capacitor manufacturing process. The overall trench capacitor manufacturing process used may be any of those known in the art such as those described in the patents mentioned above. Alternatively, other variations on trench capacitor manufacturing processes may also be used (e.g., processes involving formation of collar oxides by the LOCOS technique).

One method of forming a deep trench capacitor in a monocrystalline semiconductor substrate, with quantum conductive barrier structures at both the interface of the strap and the substrate and the interface of the strap and the trench electrode, comprises:

(a) providing a monocrystalline semiconductor substrate having (i) a buried plate about an exterior portion of a trench in the substrate, (ii) a node dielectric about at least a lower interior portion of the trench, and (iii) an electrode in the trench, (b) removing an upper portion of the electrode to provide space for a conductive strap, thereby exposing electrode and substrate surface, (c) reacting the exposed surface of the electrode and the substrate about the space with a nitrogen compound to form a quantum conductive layer on the electrode and substrate surfaces, (d) depositing a thin companion semiconductor layer over said quantum conductive barrier layer, and (e) filling the space over the companion layer with a conductive strap material. Preferably, a collar oxide is provided about the upper interior portion of the trench in step (a). Shallow trench isolation would typically be formed after filling step (e) by etching to define a space for the isolation and filling that space with the desire shallow trench isolation material. Where formation of the quantum conductive layer(s) by reaction with the underlying surface is not desired, the quantum conductive layer may be formed by processes where chemical vapor deposition, physical vapor deposition, sputtering or other appropriate deposition technique is substituted for reacting step (c).

Where a quantum conductive barrier structure is desired only at the interface of the strap and the trench electrode, a mask layer may be directionally deposited (e.g., by HDP deposition) over the layer formed in step (d) whereby the mask is thicker over the companion layer on the trench electrode surface. This mask may be removed from the companion layer on the substrate surface by isotropic etching (with partial reduction in thickness of the mask over the companion layer on the trench electrode surface. The quantum conductive layer and companion layer on the substrate surface are then preferably removed by a selective isotropic etch to re-expose the substrate surface first exposed in step (b). The remaining mask over the companion layer on the trench electrode surface may then by removed by a further selective etch process. The process could then continue with filling step (e).

Alternatively, a deep trench capacitor according to the invention with a quantum conductive layer at the interface of the strap and the trench electrode may be formed by:

(a) providing a monocrystalline semiconductor substrate having (i) a buried plate in an exterior portion of trench in the substrate, (ii) a node dielectric about at least a lower interior portion of the trench, and (iii) an electrode in the trench, (b) removing an upper portion of the electrode to provide space for a conductive strap, thereby exposing electrode and substrate surface, (c) directionally depositing a thin dielectric material layer on the electrode surface, (d) depositing a companion layer over the thin dielectric material layer, (e) isotropically etching the thin dielectric material layer and companion layer to remove any dielectric material and companion layer deposited on the exposed substrate surface, thereby leaving a quantum conductive structure on the electrode surface only, and (f) filling the space formed in step (b) with a conductive strap material.

Preferably, a collar oxide is provided about the upper interior portion of the trench in step (a). Shallow trench isolation would typically be formed after filling step (f) by etching to define a space for the isolation and filling that space with the desired shallow trench isolation material.

Where a surface strap is used, the above processes would be modified by eliminating steps for forming space for the buried strap. Similarly, the process could be modified where other strap formation techniques or configurations are employed. Where a trench capacitor formation process does not naturally provide the surface where a quantum barrier is desired, such a process can be modified by adding appropriate etch back, layer formation and fill steps, the etch and fill steps being selected from those known in the art for the specific materials involved.

What is claimed is:

1. A deep trench capacitor in a monocrystalline semiconductor substrate, said capacitor comprising (i) a buried plate in said substrate about an exterior portion of a trench in said substrate, (ii) a node dielectric about at least a lower interior portion of said trench, (iii) an electrode in said trench, and (iv) a conductive strap extending away from said trench electrode, the conductive strap being electrically connected to the trench electrode and the monocrystalline substrate, said capacitor further comprising (v) a barrier layer structure between said monocrystalline substrate and said trench electrode, said barrier layer structure comprising a quantum conductive layer with a companion semiconductor material layer, said companion layer differing in degree of crystallinity from said trench electrode.

2. The capacitor of claim 1 further comprising an oxide collar about an upper interior region of said trench.

3. The capacitor of claim 1 wherein said barrier layer structure is located at an interface between said conductive strap and said monocrystalline substrate.

4. The capacitor of claim 1 wherein said quantum conductive material is selected from the group consisting of silicon nitride, silicon oxynitride, alumina, germanium oxide and yttria-stabilized zirconia.

5. The capacitor of claim 1 wherein said quantum conductive material layer has a thickness of less than about 50 Å.

6. The capacitor of claim 1 wherein said quantum conductive material layer has a thickness of about 5–30 Å.

7. The capacitor of claim 3 wherein said barrier layer structure is substantially coextensive with said interface.

8. The capacitor of claim 1 wherein said conductive strap is a buried strap.

9. The capacitor of claim 1 wherein said conductive strap comprises polycrystalline silicon.

10. The capacitor of claim 1 wherein said trench electrode comprises doped polycrystalline silicon.

11. The capacitor of claim 1 wherein said monocrystalline semiconductor comprises undoped silicon or lightly doped silicon.

12. The capacitor of claim 3 further comprising an additional barrier layer structure located at an interface between said trench electrode and said conductive strap, said additional barrier layer structure comprising a quantum conductive layer and a companion semiconductor material layer.

13. The capacitor structure of claim 1 wherein said semiconductor material layer of said barrier layer structure is doped.

14. The capacitor structure of claim 5 wherein at least a portion of said quantum conductive material is a silicon oxynitride having a oxygen concentration of about $1.6 \times 10^{14}$ to $3.5 \times 10^{15}$ atoms/cm$^2$ and a nitrogen concentration of about $1.2 \times 10^{14}$ to $3.5 \times 10^{15}$ atoms/cm$^2$, said concentrations being measured by SIMS.

15. The capacitor structure of claim 5 wherein said quantum conductive material has a carbon content less than about $1 \times 10^{14}$ atoms/cm$^2$, said concentration being measured by SIMS.

* * * * *